(12) United States Patent
Kim et al.

(10) Patent No.: US 9,362,304 B2
(45) Date of Patent: Jun. 7, 2016

(54) NONVOLATILE MEMORY DEVICE AND METHOD OF FABRICATING THE SAME

(71) Applicant: SK hynix Inc., Gyeonggi-do (KR)

(72) Inventors: Min-Soo Kim, Gyeonggi-do (KR);
Young-Jin Lee, Gyeonggi-do (KR);
Jin-Hae Choi, Gyeonggi-do (KR);
Joo-Hee Han, Gyeonggi-do (KR);
Sung-Jin Whang, Gyeonggi-do (KR);
Byung-Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/701,232

(22) Filed: Apr. 30, 2015

(65) Prior Publication Data
US 2015/0236039 A1 Aug. 20, 2015

Related U.S. Application Data

(62) Division of application No. 13/718,388, filed on Dec. 18, 2012, now Pat. No. 9,130,053.

(30) Foreign Application Priority Data

Aug. 21, 2012 (KR) .................. 10-2012-0091116

(51) Int. Cl.
*H01L 27/115* (2006.01)
*H01L 29/66* (2006.01)
*H01L 21/28* (2006.01)

(52) U.S. Cl.
CPC .... *H01L 27/11582* (2013.01); *H01L 21/28282* (2013.01); *H01L 29/66666* (2013.01); *H01L 29/66833* (2013.01)

(58) Field of Classification Search
CPC ........ H01L 27/115; H01L 29/66; H01L 21/28
USPC .................. 257/324, 532, 528, 536, E29.325; 438/268, 270, 592, 259, 201, 212, 257
See application file for complete search history.

(56) References Cited

U.S. PATENT DOCUMENTS

| 6,232,224 B1 * | 5/2001 | Inoue ............................ 438/639 |
| 2010/0240184 A1 * | 9/2010 | Jung et al. ..................... 438/270 |
| 2011/0057250 A1 * | 3/2011 | Higashi ......................... 257/324 |
| 2011/0062510 A1 * | 3/2011 | Joo ............................... 257/324 |
| 2013/0069139 A1 * | 3/2013 | Ishihara et al. ............... 257/324 |

* cited by examiner

*Primary Examiner* — Sheng Zhu
(74) *Attorney, Agent, or Firm* — IP & T Group LLP

(57) ABSTRACT

This technology relates to a nonvolatile memory device and a method of fabricating the same. The nonvolatile memory device may include a pipe connection gate electrode configured to have a bottom buried in a groove formed in a substrate, one or more pipe channel layers formed within the pipe connection gate electrode, pairs of main channel layers each coupled to the pipe channel layer and extended in a direction substantially perpendicular to the substrate, and a plurality of interlayer insulating layers and a plurality of cell gate electrodes alternately stacked along the main channel layers, wherein the pipe connection gate electrode includes a metal silicide layer formed within the groove. The electric resistance of the pipe connection gate electrode may be greatly reduced without an increase in a substantial height by forming the metal silicide layer buried in the substrate under the pipe connection gate electrode.

14 Claims, 13 Drawing Sheets

NONVOLATILE MEMORY DEVICE AND METHOD OF FABRICATING THE SAME

CROSS-REFERENCE TO RELATED APPLICATIONS

This application is a division of U.S. patent application Ser. No. 13/718,388 filed on Dec. 18, 2012, which claims priority of Korean Patent Application No. 10-2012-0091116, filed on Aug. 21, 2012. The disclosure of each of the foregoing application is incorporated herein by reference in its entirety.

BACKGROUND

1. Field

Exemplary embodiments of the present invention relate to a nonvolatile memory device and a method of fabricating the same, and more particularly, to a three-dimensional (3-D) structured nonvolatile memory device in which a plurality of memory cells are stacked in a vertical direction over a substrate and a method of fabricating the same.

2. Description of the Related Art

A nonvolatile memory device retains stored data although the power is not supplied. A variety of nonvolatile memory devices, such as flash memory, are being widely used.

As the improvement of the degree of integration of two-dimensional (2-D) structured nonvolatile memory devices with memory cells that are formed over a semiconductor substrate in the form of a single layer has reached the limit, there has been proposed a 3-D structured nonvolatile memory device in which a plurality of memory cells is formed along channel layers in a vertical direction over a semiconductor substrate. More particularly, the 3-D structured nonvolatile memory device is mainly divided into a structure having a straight-line type channel layer and a structure having a U-shaped channel layer.

In the structure having a U-shaped channel layer, a pipe connection transistor is used to couple memory cell strings. However, there is a concern in that electric resistance may increase, because the gate electrode of the pipe connection transistor (hereinafter referred to as a pipe connection gate electrode) is mainly made of polysilicon. In particular, an increase in the height of the pipe connection gate electrode to reduce the electric resistance of the pipe connection gate electrode may be limited in a subsequent process.

SUMMARY

Exemplary embodiments of the present invention are directed to a nonvolatile memory device in which the electric resistance of a pipe connection gate electrode may be greatly reduced without an increase in a substantial height, because a metal silicide layer is buried in a substrate under the pipe connection gate electrode and a method for fabricating the same.

In accordance with an embodiment of the present invention, a nonvolatile memory device may include a pipe connection gate electrode configured to have a bottom buried in a groove formed in a substrate, one or more pipe channel layers formed within the pipe connection gate electrode, pairs of main channel layers each coupled to the pipe channel layer and extended in a direction substantially perpendicular to the substrate, and a plurality of interlayer insulating layers and a plurality of cell gate electrodes alternately stacked along the main channel layers, wherein the pipe connection gate electrode includes a metal silicide layer formed within the groove.

In accordance with another embodiment of the present invention, a method of fabricating a nonvolatile memory device may include forming a groove by selectively etching a substrate, forming a metal silicide layer within the groove, forming a conductive layer for a gate electrode, in which has at least one or more sacrificial layer patterns, over a substrate in which the metal silicide layer is formed, and forming a pipe connection gate electrode by selectively etching the conductive layer for a gate electrode.

DETAILED DESCRIPTION

Figure 1:
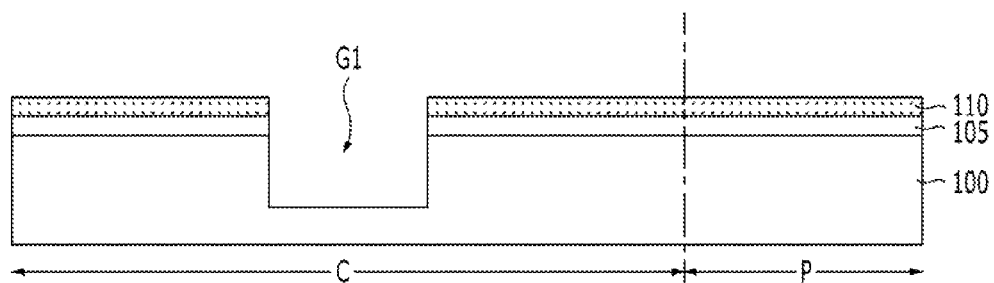
FIGS. 1 to 19 are cross-sectional views illustrating a nonvolatile memory device and a method of fabricating the same in accordance with embodiments of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 1 to 19 are cross-sectional views illustrating a nonvolatile memory device and a method of fabricating the same in accordance with embodiments of the present invention. In particular, FIG. 19 is a cross-sectional view illustrating the nonvolatile memory device in accordance with an embodiment of the present invention, and FIGS. 1 to 18 are cross-sectional views illustrating an example of intermediate process steps for fabricating the nonvolatile memory device of FIG. 19.

Referring to FIG. 1, a first isolation insulating layer 105 is formed on a substrate 100 including a cell region C and a peripheral region P. The substrate 100 may be a semiconductor substrate, such as single crystalline silicon, and the substrate 100 may include specific underlying structures (not shown). Furthermore, the first isolation insulating layer 105 may include an oxide-based or nitride-based material.

A first hard mask pattern 110 through which part of a region where a pipe connection gate electrode to be described later will be formed is exposed is formed on the first isolation insulating layer 105. A first groove G1 is formed by etching the first isolation insulating layer 105 and the substrate 100 in the cell region C using the first hard mask pattern 110 as an etch mask.

The first hard mask pattern 110 may include one or more selected from the group that includes an oxide-based or nitride-based material, polysilicon, an amorphous carbon layer (ACL), and a bottom anti-reflective coating (BARC)

layer. In particular, the first groove G1 is a space in which the bottom of the pipe connection gate electrode will be buried and may be separated by a block.

Figure 2:
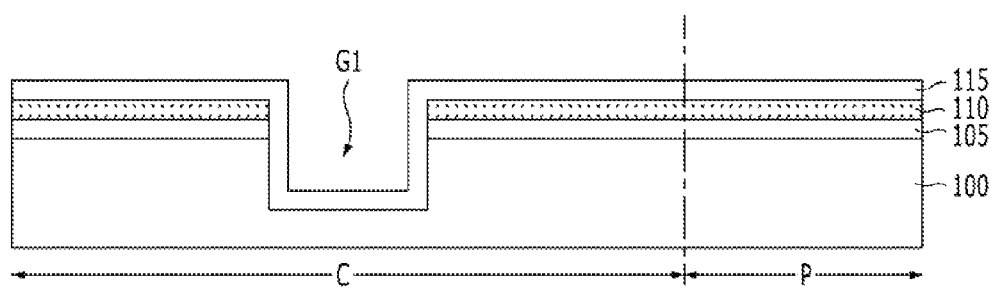

Referring to FIG. 2, a second isolation insulating layer 115 is formed on the entire surface of the substrate 100 in which the first groove G1 is formed. The second isolation insulating layer 115 may be formed by depositing an oxide-based or nitride-based material using an atomic layer deposition (ALD) or chemical vapor deposition (CVD) method.

Figure 3:
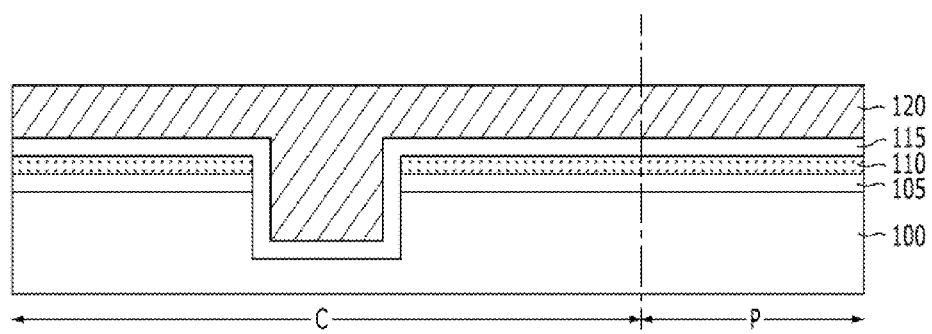

Referring to FIG. 3, a semiconductor layer 120 is formed on the second isolation insulating layer 115. The semiconductor layer 120 includes a semiconductor material, such as silicon (Si), which may form a compound by a reaction with metal. The semiconductor layer 120 may be formed by depositing polysilicon, for example, to a thickness that fully fills the first groove G1 using an ALD or CVD method.

Figure 4:
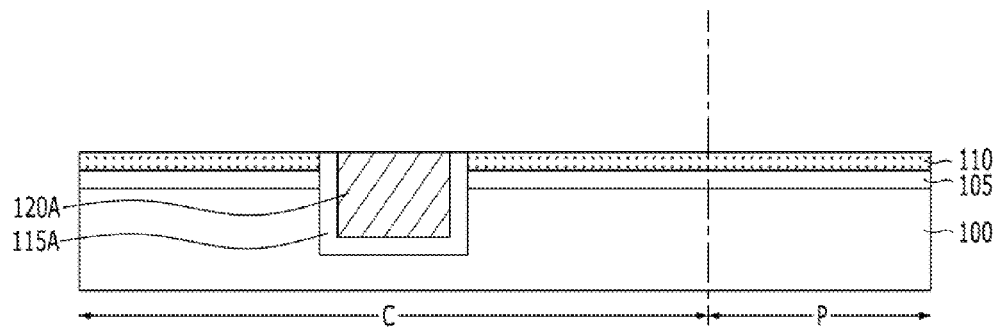

Referring to FIG. 4, a polishing process, such as chemical mechanical polishing (CMP), is performed until a top surface of the first hard mask pattern 110 is exposed. The second isolation insulating layer 115 and the semiconductor layer 120 remaining within the first groove G1 as a result of this process are hereinafter referred to as a second isolation insulating layer pattern 115A and a semiconductor layer pattern 120A, respectively.

Figure 5:
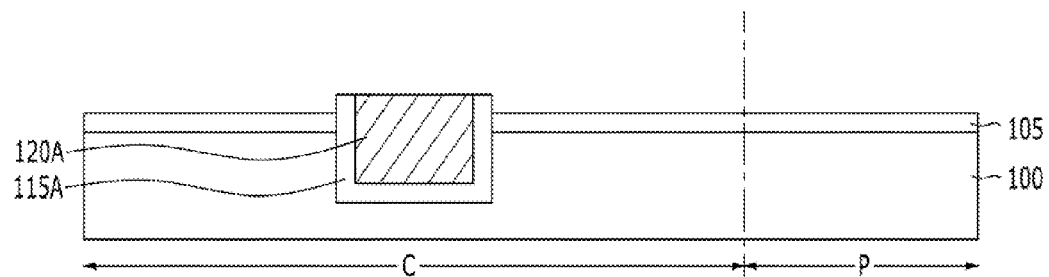

Referring to FIG. 5, the first isolation insulating layer 105 is exposed by removing the first hard mask pattern 110. In order to remove the first hard mask pattern 110, an etch process using an etch selectivity with the second isolation insulating layer pattern 115A and the semiconductor layer pattern 120A may be performed.

Figure 6:
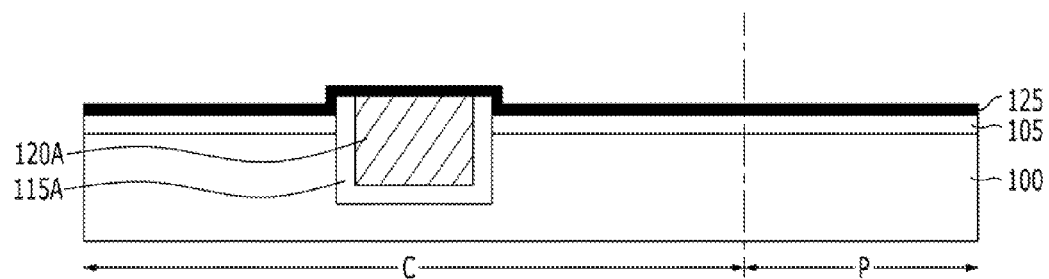

Referring to FIG. 6, a metal layer 125 is formed on the entire surface of the substrate 100 including the semiconductor layer pattern 120A. The metal layer 125 may be formed by depositing metal, for example, one or more selected from the group that includes cobalt (Co), tungsten (W), nickel (Ni), titanium (Ti), platinum (Pt), and palladium (Pd) which may form a compound by a reaction with a semiconductor material, such as silicon (Si).

Figure 7:
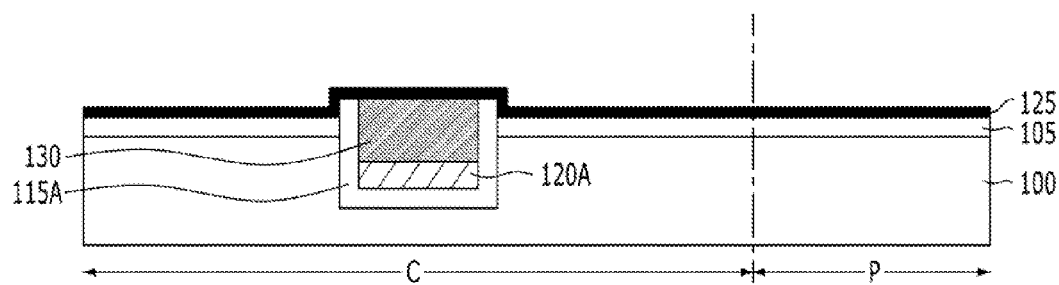

Referring to FIG. 7, the substrate 100 in which the metal layer 125 is formed is annealed. The annealing process may be performed using a rapid thermal annealing (RTA) or furnace annealing method. As a result of this process, an upper part of the semiconductor layer pattern 120A, that is in contact with the metal layer 125, is silicided, thereby forming a metal silicide layer 130.

The metal silicide layer 130 may include cobalt silicide ($CoSi_x$), tungsten silicide ($WSi_x$), nickel silicide ($NiSi_x$), titanium silicide ($TiSi_x$), platinum silicide ($PtSi_x$), or palladium silicide ($PdSi_x$). In particular, a region where the metal silicide layer 130 is formed may be limited within the first groove G1. Accordingly, the characteristics of a memory layer to be described later may not deteriorate, because the metal silicide layer 130 is formed.

Figure 8:
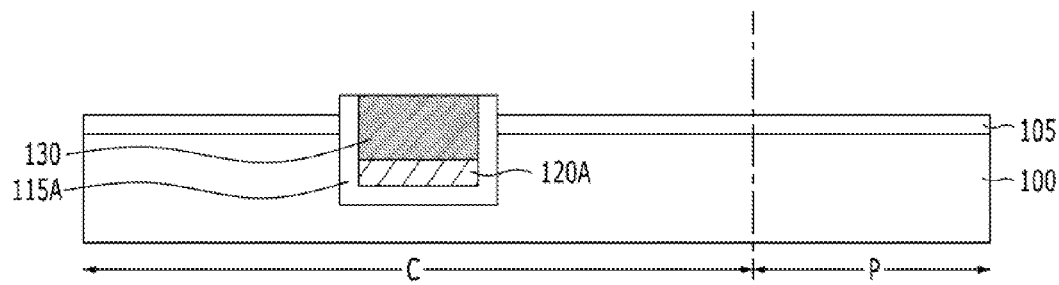

Referring to FIG. 8, a strip process of removing the metal layer 125 remaining without a reaction in the annealing process is performed. In order to remove the remaining metal layer, a mixed solution of sulfuric acid ($H_2SO_4$) and hydrogen peroxide ($H_2O_2$), that is, a sulfuric acid and hydro-peroxide mixture (SPM), may be used. After the strip process, an additional annealing process may be performed.

Figure 9:
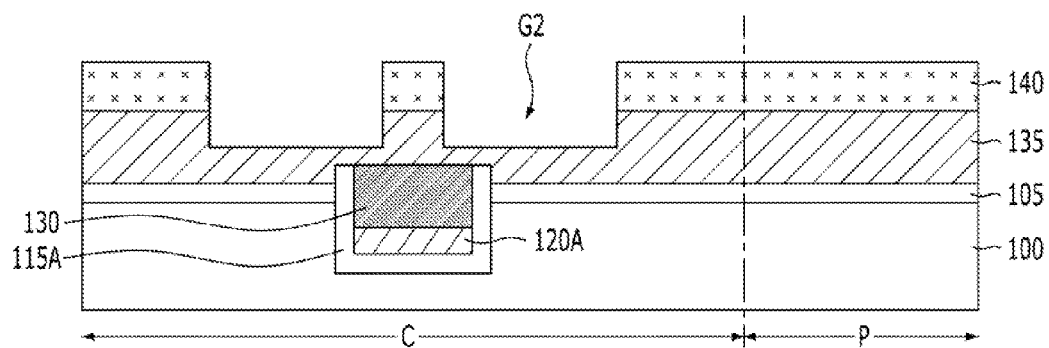

Referring to FIG. 9, a first conductive layer 135 for gate electrodes is formed on the results in which the metal layer 125 is removed. The first conductive layer 135 for gate electrodes may be formed by depositing a conductive material, such as doped polysilicon, using an ALD or CVD method.

A second hard mask pattern 140 through which regions where sacrificial layer patterns to be described later will be formed are exposed is formed on the first conductive layer 135 for gate electrodes. Second grooves G2 are formed by etching the first conductive layer 135 for gate electrodes in the cell region C using the second hard mask pattern 140 as an etch mask. The second hard mask pattern 140 may comprise one or more selected from the group that includes an oxide-based or nitride-based material, polysilicon, an ACL, and a BARC layer.

Figure 10:
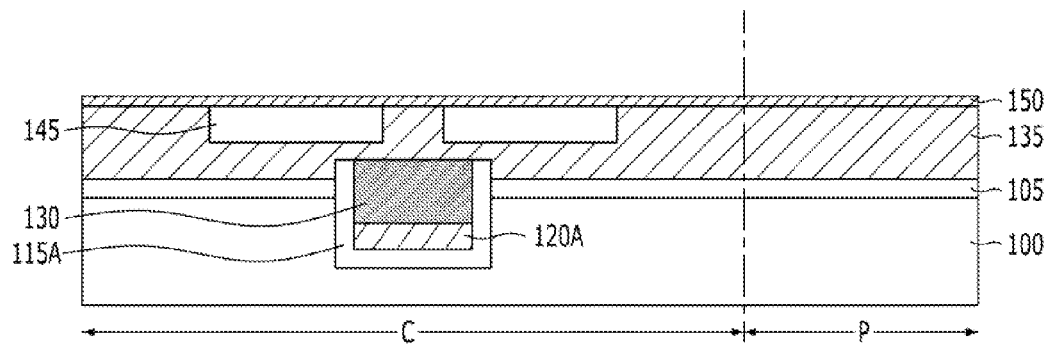

Referring to FIG. 10, after removing the second hard mask pattern 140, sacrificial layer patterns 145 buried in the respective second grooves G2 are formed. The sacrificial layer patterns 145 are removed in a subsequent process, thus functioning to provide spaces where pipe channel holes will be formed. The sacrificial layer patterns 145 may include a material having an etch rate different from an etch rate of a second conductive layer for gate electrodes, first material layers, second material layers, which will be described later, and the first conductive layer 110 for gate electrodes. Furthermore, each of the sacrificial layer patterns 145 may have an island form that has a long axis in the direction of the cross section of FIG. 9 and a short axis in a direction crossing the cross section of FIG. 9. A plurality of the sacrificial layer patterns 145 may be arranged in a matrix form when seen from a plane parallel to the substrate 100.

A second conductive layer 150 for gate electrodes is formed on the first conductive layer 135 for gate electrodes and the sacrificial layer patterns 145. The second conductive layer 150 for gate electrodes may be formed by depositing a conductive material, such as doped polysilicon, using an ALD or CVD method.

Figure 11:
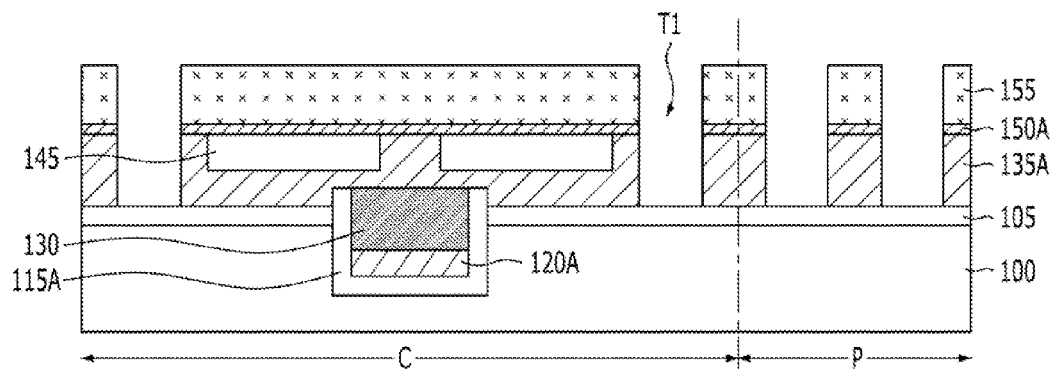

Referring to FIG. 11, a third hard mask pattern 155 covering regions where a pipe connection gate electrode and peripheral gate electrodes to be described later will be formed is formed on the second conductive layer 150 for gate electrodes. Trenches T1 through which the first isolation insulating layer 105 is exposed are formed by etching the second conductive layer 150 and the first conductive layer 135 using the third hard mask pattern 155 as an etch mask.

The third hard mask pattern 155 may include one or more selected from the group that includes an oxide-based or nitride-based material, polysilicon, an ACL, and a BARC layer. Meanwhile, the first conductive layers 135 for gate electrodes and the second conductive layers 150 for gate electrodes separated by the trenches T1 are hereinafter referred to as first conductive layer patterns 135A for gate electrodes and second conductive layer patterns 150A for gate electrodes.

As a result of this process, the pipe connection gate electrode and the peripheral gate electrodes are formed in the cell region C and the peripheral region P, respectively. The pipe connection gate electrode and the peripheral gate electrodes have a form in which the first conductive layer patterns 135A and the second conductive layer patterns 150A are sequentially stacked. In particular, the pipe connection gate electrode may include the metal silicide layer 130, which is in contact with the bottom of the first conductive layer pattern 135A for gate electrodes, and the semiconductor layer pattern 120A in the cell region C. Furthermore, the pipe connection gate electrode may be separated on a block basis.

Figure 12:
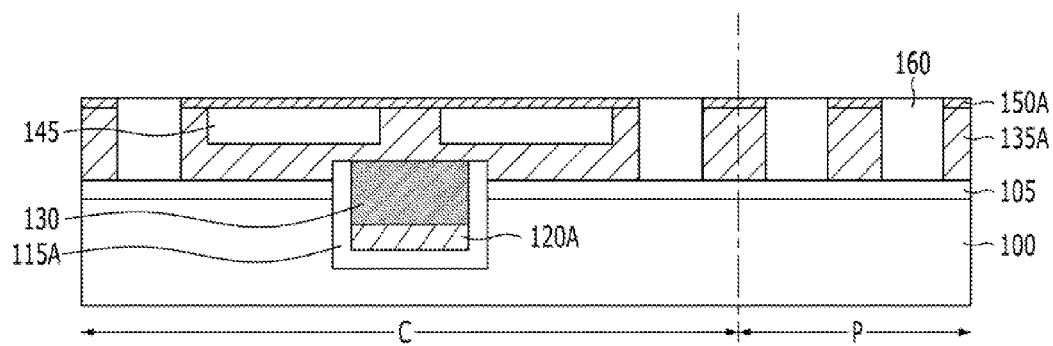

Referring to FIG. 12, after removing the third hard mask pattern 155, first burial insulating layers 160 are formed within the trenches T1. The first burial insulating layers 160 may be formed by depositing an oxide-based or nitride-based material to a thickness that fills the trenches T1 and then performing a polishing process, such as chemical mechanical polishing (CMP), until a top surface of the second conductive layer patterns 150A for gate electrodes is exposed.

Figure 13:
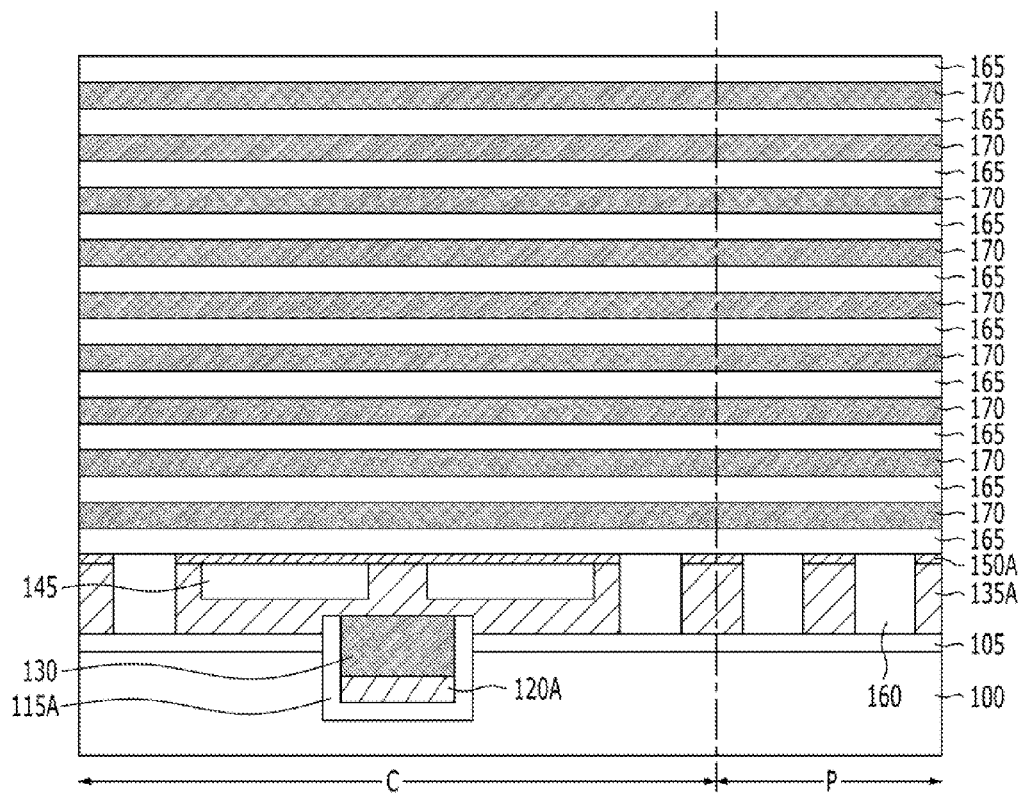

Referring to FIG. 13, a plurality of first material layers 165 and a plurality of second material layers 170 are alternately stacked over the second conductive layer patterns 150A for gate electrodes and the first burial insulating layers 160. A structure in which the plurality of first material layers 165 and the plurality of second material layers 170 are alternately stacked is hereinafter referred to as a stack structure, for convenience of description. Meanwhile, the first material layers 165 may be disposed at the top and bottom of the stack structure. The cross section of FIG. 13 illustrates that the number of second material layers 170 is nine, but this is only illustrative. The number of second material layers 170 may be less than or greater than nine.

In the present embodiment, the first material layer 165 may be an interlayer insulating layer, and the second material layer 170 may be a sacrificial layer that is removed in a subsequent process, thus providing a space where a cell gate electrode will be formed. In this case, the first material layer 165 may include an oxide-based material, and the second material layer 170 may include a material having an etch rate different from an etch rate of the first material layer 165, for example, a nitride-based material.

However, the present invention is not limited to the above examples. In another embodiment, the first material layer 165 may be an interlayer insulating layer, and the second material layer 170 may be a conductive layer for a cell gate electrode. In this case, the first material layer 165 may include an oxide-based material, and the second material layer 170 may include a conductive material, such as polysilicon. In yet another embodiment, the first material layer 165 may be a sacrificial layer that provides a space where an interlayer insulating layer will be formed, and the second material layer 170 may be a conductive layer for a cell gate electrode. In this case, the first material layer 165 may include undoped polysilicon, and the second material layer 170 may include a conductive material, such as doped polysilicon.

Figure 14:
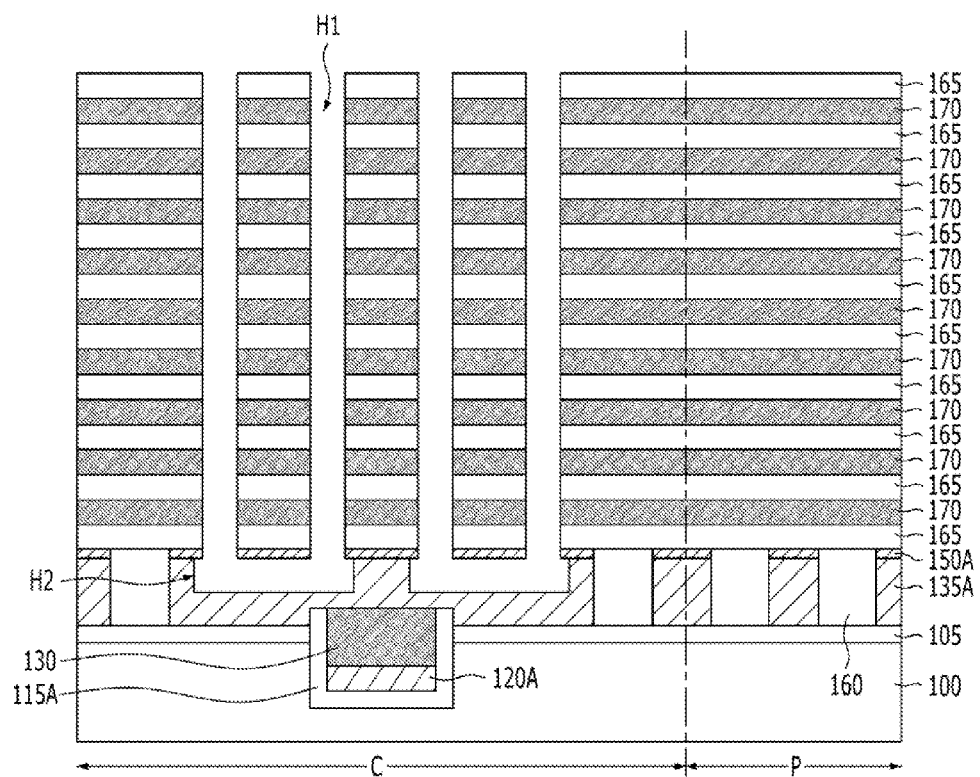

Referring to FIG. 14, pairs of main channel holes H1 through which the sacrificial layer patterns 145 are exposed are formed by selectively etching the stack structure and the second conductive layer patterns 150A for gate electrodes. Each of the main channel holes H1 may have a circular or oval shape when viewed from a plane parallel to the substrate 100, and each of the pairs of main channel holes H1 may be placed in each of the sacrificial layer patterns 145.

The sacrificial layer patterns 145 exposed by the pairs of main channel holes H1 are removed. In order to remove the sacrificial layer patterns 145, a wet etch process using an etch selectivity with the pipe connection gate electrode and the stack structure may be performed. As a result of this process, pipe channel holes H2 each coupling a pair of the main channel holes H1 are formed in the respective spaces from which the sacrificial layer patterns 145 are removed.

Figure 15:
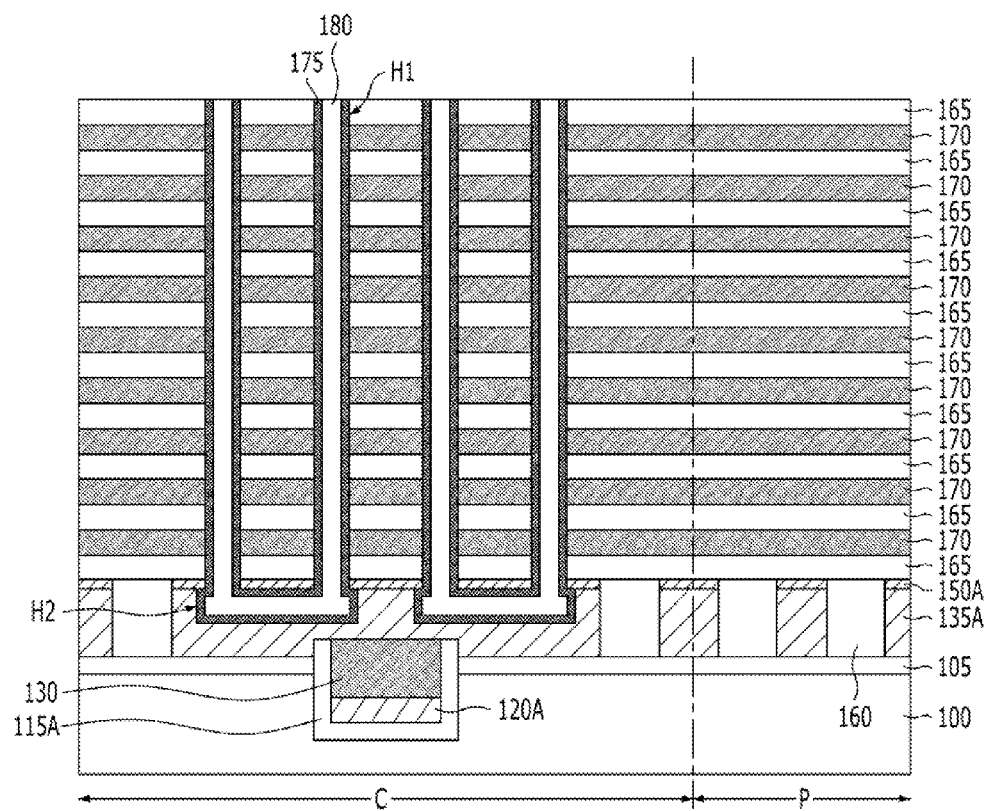

Referring to FIG. 15, a memory layer 175 and a channel layer 180 are sequentially formed on the inner walls of the pairs of main channel holes H1 and the pipe channel holes H2. The memory layer 175 may be formed by depositing a charge blocking layer, a charge trap layer, and a tunnel insulating layer sequentially.

The tunnel insulating layer is for charge tunneling and may include an oxide layer, for example. The charge trap layer is configured to store data by trapping charges, and the charge trap layer may include a nitride layer, for example. The charge blocking layer is configured to preclude charges within the charge trap layer from moving externally. The charge blocking layer may include an oxide layer, for example. That is, the memory layer 175 may have a triple structure of Oxide-Nitride-Oxide (ONO) layers.

Furthermore, the channel layer 180 may be formed by depositing a semiconductor material, such as polysilicon, and may be divided into a main channel layer within the main channel hole H1 and a pipe channel layer within the pipe channel hole H2. In particular, the main channel layer may be used as the channel of a memory cell or a select transistor, and the pipe channel layer may be used as the channel of a pipe connection transistor. Meanwhile, in the present embodiment, the channel layer 180 is illustrated as being formed to a thickness that fully fills the main channel holes H1 and the pipe channel holes H2, but the present invention is not limited thereto. In another embodiment, the channel layer 180 may be formed to a thickness that does not fully fill the main channel holes H1 and the pipe channel holes H2.

Figure 16:
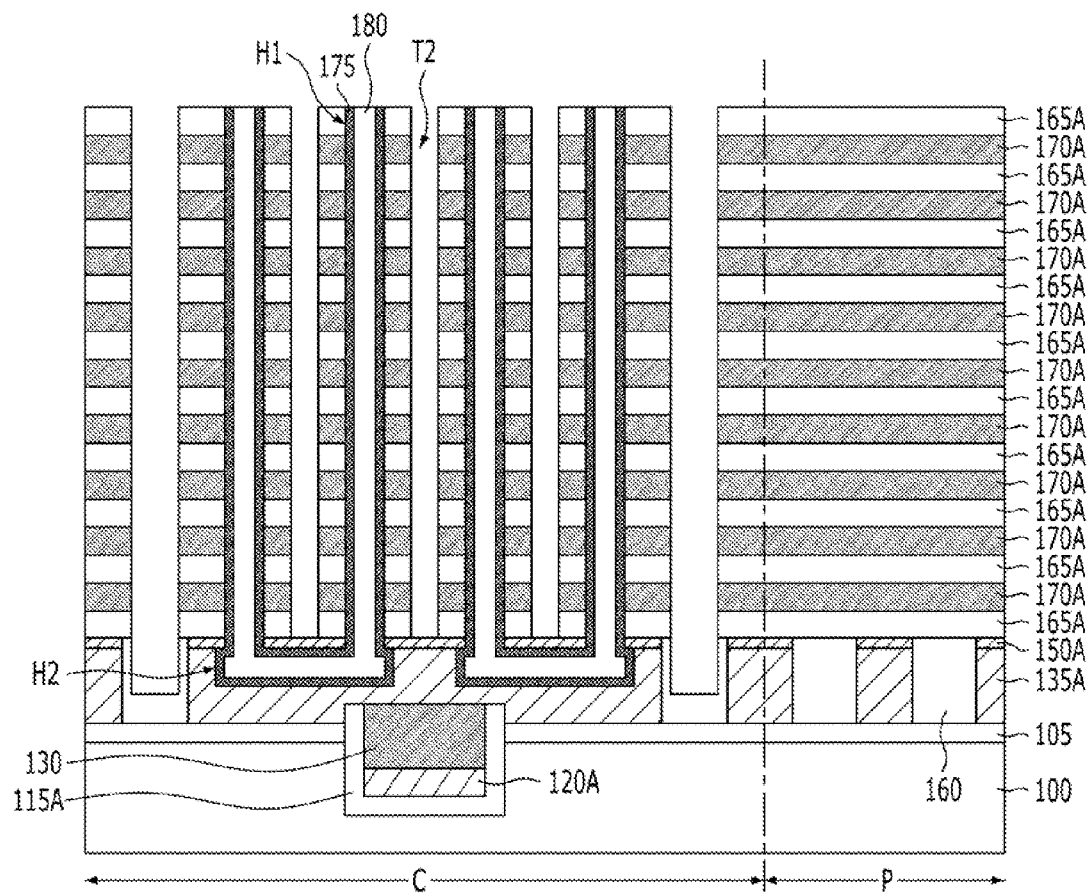

Referring to FIG. 16, slits T2 are formed by selectively etching the stack structure on both sides of each of the main channel holes H1. Each of the slits T2 separates the first material layers 165 and the second material layers 170 of the cell region C in a line form. The slit T2 may be extended in a direction crossing the cross section of FIG. 16, and a plurality of the slits T2 may be arranged in parallel. Meanwhile, as a result of this process, the first burial insulating layers 160 may be partially etched, and the separated first material layers 165 and the separated second material layers 170 are hereinafter referred to as first material layer patterns 165A and second material layer patterns 170A, respectively.

Figure 17:
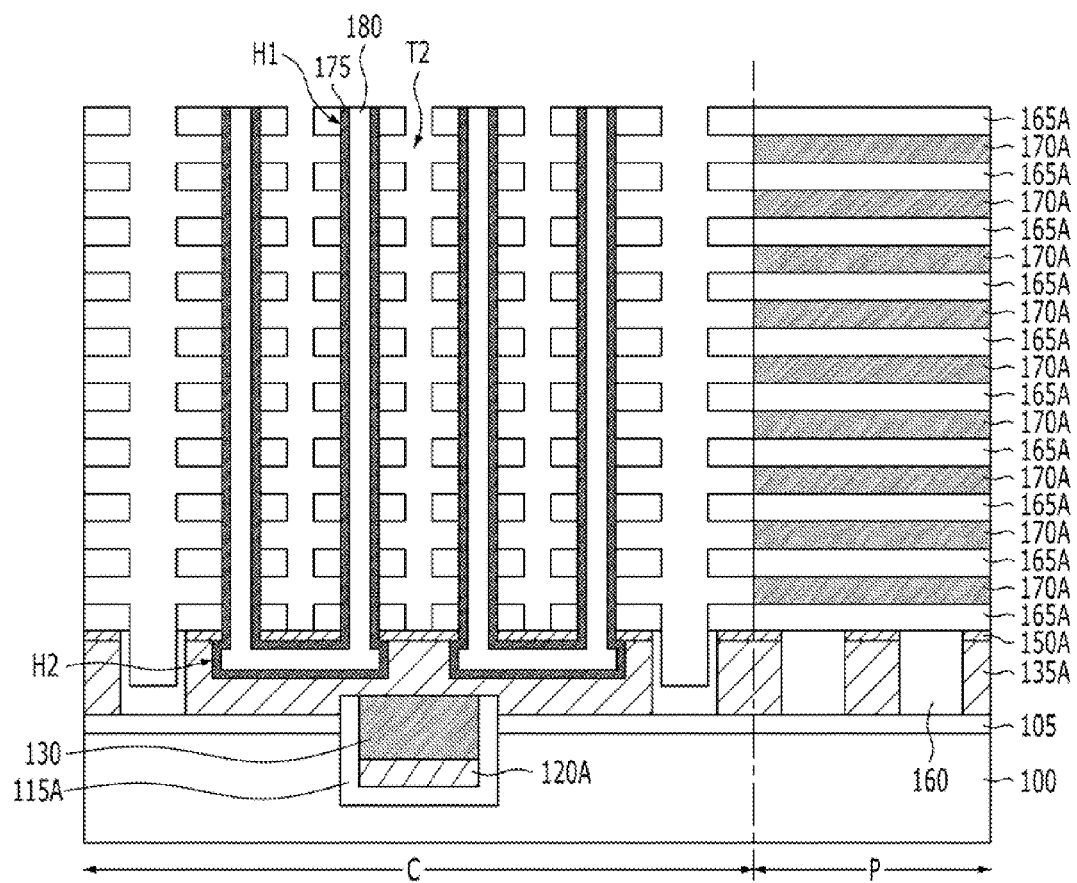

Referring to FIG. 17, the second material layer patterns 170A of the cell region C exposed by the formation of the slits T2 are removed. In order to remove the second material layer patterns 170A, a wet etch process using an etch selectivity with the first material layer patterns 165A may be performed.

Figure 18:
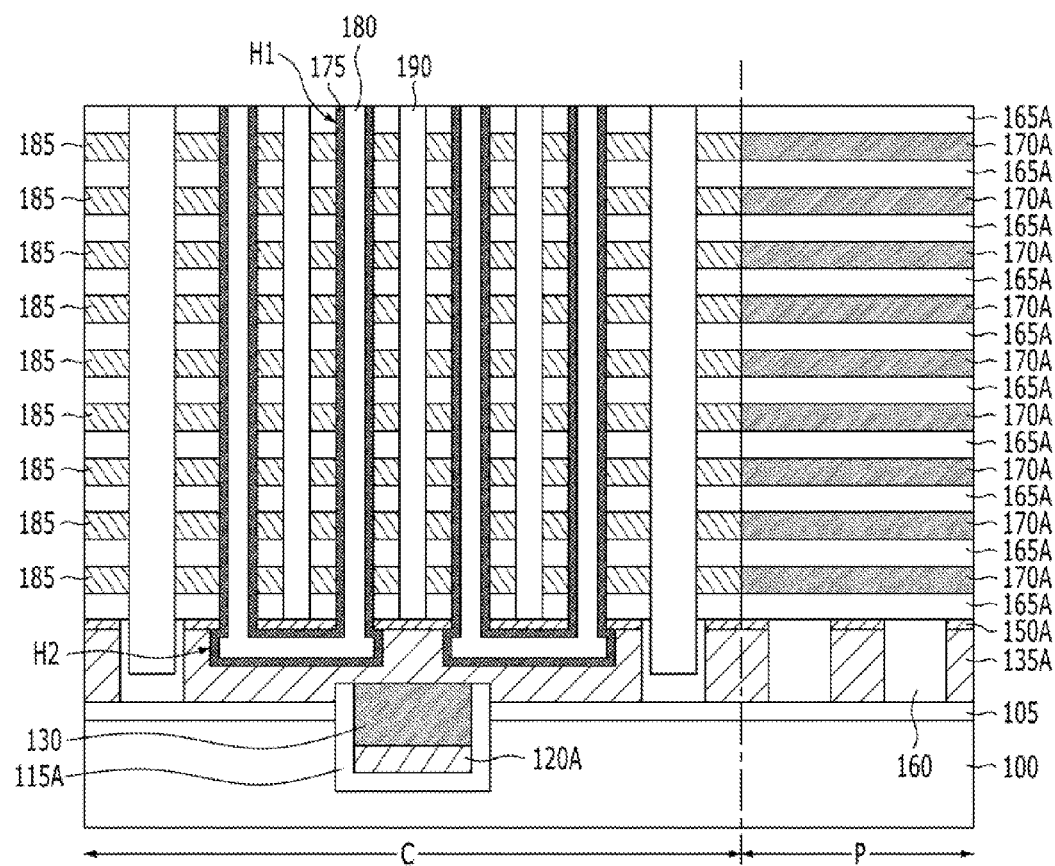
Figure 19:
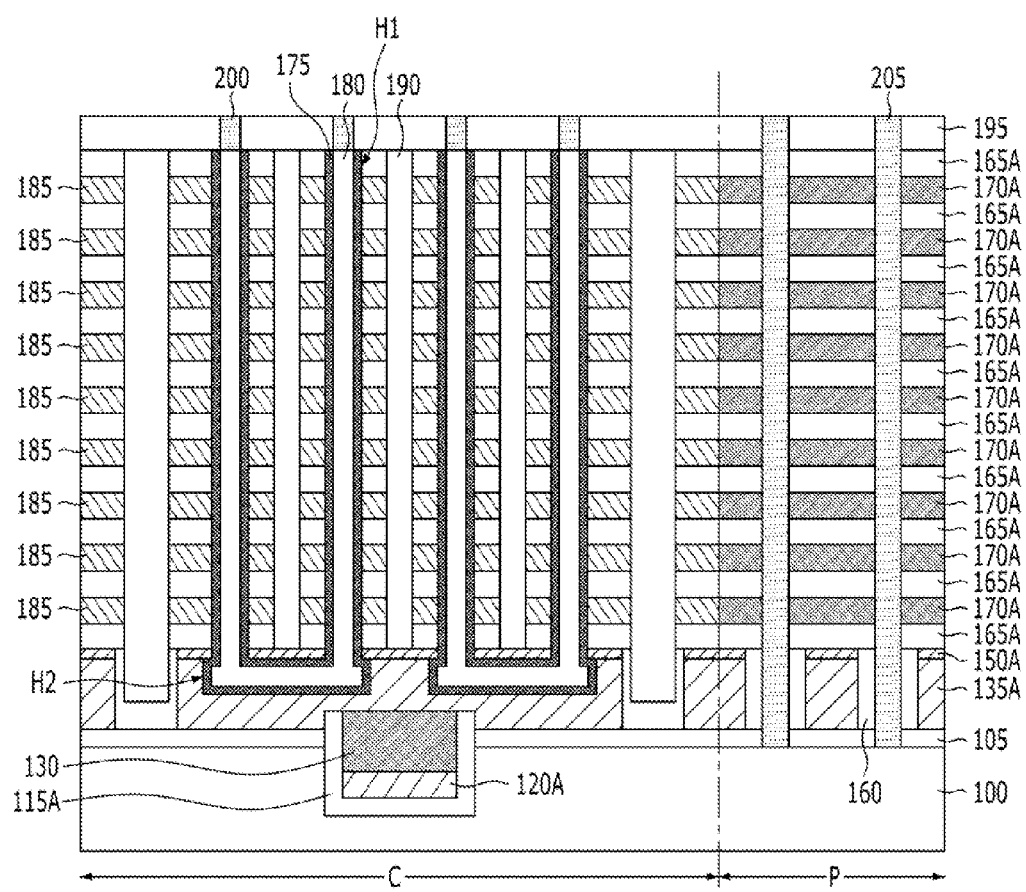

Referring to FIG. 18, cell gate electrodes 185 are formed in the spaces from which the second material layer patterns 170A are removed. The cell gate electrodes 185 may be formed by the following process.

First, a conductive layer (not shown) for the cell gate electrodes is formed to a thickness that fills the spaces from which the second material layer patterns 170A are removed by conformably depositing a conductive material, such as metal or metal nitride, using an ALD or CVD method. The conductive layer for the cell gate electrodes is etched until the sides of the first material layer patterns 165A are exposed, with the result that the conductive layer is separated for each layer, and the cell gate electrode 185 is formed between the first material layer patterns 165A.

Next, second burial insulating layers 190 are formed within the slits T2. The second burial insulating layers 190 may be formed by depositing an oxide-based or nitride-based material to a thickness that fills the slits T2 and then performing a polishing process, such as CMP, until a top surface of the first material layer patterns 165A is exposed.

Referring to FIG. 19, a second interlayer insulating layer 195 is formed on the results in which the second burial insulating layers 190 are formed. The second interlayer insulating layer 195 may be formed by depositing an oxide-based or nitride-based material.

First contact plugs 200, which are coupled with the respective channel layers 180 in the cell region C, configured to penetrate the second interlayer insulating layer 195, are formed. Second contact plugs 205, which are coupled with the junction (not shown) of the substrate 100 in the peripheral region P, configured to penetrate the second interlayer insulating layer 195, the stack structure, the first burial insulating layer 160, and the first isolation insulating layer 105, are formed. The first and the second contact plugs 200 and 205 may include a conductive material, such as doped polysilicon, metal, or metal nitride.

In accordance with the above-described fabrication method, the nonvolatile memory device in accordance with the embodiment of the present invention, such as that shown in FIG. 19, may be fabricated.

Referring to FIG. 19, the nonvolatile memory device in accordance with the embodiment of the present invention includes the pipe connection gate electrode configured to have a bottom buried in the groove formed in the substrate 100 having the cell region C and the peripheral region P, the first isolation insulating layers 105 and the second isolation insulating layer pattern 115A interposed between the pipe connection gate electrode and the substrate 100, the channel layers 180 each configured to include one or more pipe channel layers formed within the pipe connection gate electrode and a pair of the main channel layers connected with the pipe channel layer and extended in a direction substantially perpendicular to the substrate 100, the plurality of first material layer patterns 165A and the plurality of cell gate electrodes 185 alternately stacked along the main channel layers, the memory layer 175 interposed between the cell gate electrodes 185, the pipe connection gate electrode, and the channel layer 180, the first contact plugs 200 connected to the top of the channel layers 180, the peripheral gate electrodes over the first isolation insulating layers 105 in the peripheral region P, and the second contact plugs 205 connected with the substrate 100 on both sides of the peripheral gate electrodes.

Here, the pipe connection gate electrode may include the first and the second conductive layer patterns 135A and 150A for gate electrodes, the metal silicide layer 130 formed within the groove, and the semiconductor layer pattern 120A configured to be in contact with the metal silicide layer 130 under the metal silicide layer 130 in the cell region C that is separated on a block basis. The peripheral gate electrode may include the first and the second conductive layer patterns 135A and 150A for gate electrodes in the peripheral region P.

Meanwhile, the channel layer 180 may have a U shape, and the memory layer 175 may surround the channel layer 180. Furthermore, the cell gate electrodes 185 may surround the sides of the main channel layers and extend in a direction crossing the cross section of FIG. 19. In particular, the substantial height of the pipe connection gate electrode may not be increased, because the bottom of the pipe connection gate electrode other than regions separated by a block is buried in the substrate 100.

In accordance with the nonvolatile memory device and the method for fabricating the same in accordance with the embodiments of the present invention, the electric resistance of the pipe connection gate electrode may be greatly reduced without an increase in a substantial height by forming the metal silicide layer buried in the substrate under the pipe connection gate electrode.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a nonvolatile memory device, comprising:
   forming a groove by selectively etching a substrate;
   forming a metal silicide layer within the groove;
   forming a conductive layer for a gate electrode, which has at least one or more sacrificial layer patterns, over the substrate in which the metal silicide layer is formed; and
   forming a pipe connection gate electrode by selectively etching the conductive layer for a gate electrode,
   wherein the pipe connection gate electrode includes:
   a first conductive layer formed over the substrate in which the metal silicide layer is formed; and
   a second conductive layer formed over the first conductive layer.

2. The method of claim 1, wherein the groove is formed by etching the substrate under a region where the pipe connection gate electrode is formed.

3. The method of claim 1, wherein the forming of the metal silicide layer comprises:
   forming a semiconductor layer within the groove;
   forming a metal layer over the semiconductor layer; and
   annealing the substrate in which the metal layer is formed.

4. The method of claim 3, further comprising removing the metal layer which is remaining without a reaction, after annealing the substrate in which the metal layer is formed.

5. The method of claim 1, wherein the sacrificial layer patterns comprise a material having an etch rate different from an etch rate of the conductive layer for a gate electrode.

6. The method of claim 1, wherein forming the conductive layer for a gate electrode comprises:
   forming the first conductive layer for a gate electrode, which has the sacrificial layer patterns, over the substrate in which the metal silicide layer is formed; and
   forming the second conductive layer for a gate electrode over the first conductive layer and the sacrificial layer patterns.

7. The method of claim 1, wherein the pipe connection gate electrode is formed by separating the conductive layer for a gate electrode by a block.

8. The method of claim 1, wherein:
   the substrate comprises a cell region and a peripheral region, and
   peripheral gate electrodes are formed by selectively etching the conductive layer in the peripheral region in the forming of the pipe connection gate electrode.

9. The method of claim 1, further comprising:
   alternately stacking a plurality of first material layers and a plurality of second material layers over the substrate in which the pipe connection gate electrode is formed, after the forming of the pipe connection gate electrode;
   forming pairs of main channel holes through which the sacrificial layer patterns are exposed by selectively etching the first material layers and the second material layers;
   forming pipe channel holes each connected with a pair of the main channel holes by removing the sacrificial layer patterns; and
   forming channel layers within the pairs of main channel holes and the pipe channel holes.

10. The method of claim 9, wherein:
    the first material layers are interlayer insulating layers, and the second material layers are sacrificial layers.

11. The method of claim 9, further comprising forming a memory layer on inner walls of the pairs of main channel holes and the pipe channel holes, after the forming of the pipe channel holes.

12. The method of claim 9, wherein the second material layers comprise a material having an etch rate different from an etch rate of the first material layers.

13. The method of claim 9, further comprising:
    forming slits in a depth that penetrates the plurality of second material layers on both sides of the main channel hole, after the forming of the channel layer;
    removing the second material layers exposed by the slits; and
    forming cell gate electrodes in spaces where the second material layers are removed.

14. The method of claim 9, further comprising:
one or more pipe channel layers formed within the pipe connection gate electrode; and
pairs of main channel layers each coupled to the pipe channel layer and extended in a direction substantially perpendicular to the substrate,
wherein the metal silicide layer is formed under the pipe channel layer.

\* \* \* \* \*